United States Patent
Rieken

(10) Patent No.: US 10,495,672 B2
(45) Date of Patent: Dec. 3, 2019

(54) FRAMEWORK FOR FAULT DETECTION AND LOCALIZATION IN POWER DISTRIBUTION NETWORKS

(71) Applicant: Aclara Technologies LLC, Hazelwood, MO (US)

(72) Inventor: David W. Rieken, St. Peters, MO (US)

(73) Assignee: Aclara Technologies LLC, Hazelwood, MO (US)

( * ) Notice: Subject to any disclaimer, the term of this patent is extended or adjusted under 35 U.S.C. 154(b) by 261 days.

(21) Appl. No.: 15/088,971

(22) Filed: Apr. 1, 2016

(65) Prior Publication Data

US 2016/0291076 A1    Oct. 6, 2016

Related U.S. Application Data

(60) Provisional application No. 62/142,791, filed on Apr. 3, 2015.

(51) Int. Cl.
*G01R 19/25* (2006.01)

(52) U.S. Cl.
CPC ................. *G01R 19/2513* (2013.01)

(58) Field of Classification Search
CPC .................................. G01R 19/2513
See application file for complete search history.

(56) References Cited

U.S. PATENT DOCUMENTS

| | | | |
|---|---|---|---|
| 5,995,911 A | 11/1999 | Hart | |
| 7,180,940 B2 | 2/2007 | Li et al. | |
| 7,684,441 B2 | 3/2010 | Bickel et al. | |
| 8,928,170 B2 | 1/2015 | Rieken | |
| 9,294,147 B2 | 3/2016 | Rieken et al. | |
| 9,318,920 B2 * | 4/2016 | Vukojevic | H02J 13/001 |
| 2003/0158677 A1 * | 8/2003 | Swarztrauber | G01D 4/008 |
| | | | 702/62 |
| 2004/0263147 A1 | 12/2004 | Piesinger | |
| 2008/0222068 A1 * | 9/2008 | Bahl | G06N 5/043 |
| | | | 706/46 |
| 2011/0208364 A1 | 8/2011 | DeLoach, Jr. | |
| 2013/0279546 A1 | 10/2013 | Rieken | |

(Continued)

FOREIGN PATENT DOCUMENTS

WO    WO2006113965 A1    11/2006

OTHER PUBLICATIONS

American National Standard for Electric Power Systems and Equipment—Voltage Ratings (60 Hertz), ANSI C84.1-2006, National Electrical Manufacturers Association, Dec. 6, 2006, 23 pages.

(Continued)

*Primary Examiner* — Jarrett J Stark
(74) *Attorney, Agent, or Firm* — Stinson LLP

(57) ABSTRACT

Systems and methods for detecting faults in a power distribution network are described. In an aspect, the systems and methods determine a probability that each node of the network is powered and a probability that each distribution line in the network is faulted. In another aspect, the systems and methods determine the probabilities by transmitting a signal over a power distribution network with an active sounding system. In an additional aspect, the systems and methods determine the probabilities by utilizing collected data coupled to the power distribution network.

17 Claims, 4 Drawing Sheets

(56) References Cited

U.S. PATENT DOCUMENTS

| | | | |
|---|---|---|---|
| 2014/0161114 A1* | 6/2014 | Shuey | H04W 56/0015 |
| | | | 370/350 |
| 2015/0229824 A1 | 8/2015 | Tanaka et al. | |
| 2016/0091881 A1 | 3/2016 | Rieken | |
| 2016/0124421 A1 | 5/2016 | Hansell et al. | |
| 2016/0154040 A1 | 6/2016 | Driscoll et al. | |
| 2016/0198245 A1 | 7/2016 | Rhoads et al. | |

OTHER PUBLICATIONS

Abdelaziz, A.Y. et al., Line Outage Detection Using Support Vector Machine (SVM) Based on the Phasor Measurement Units (PMUs) Technology, IEEE (2012), 8 pages.

Bouhafs, Faycal et al., Links to the Future, IEEE Power & Energy (Jan./Feb. 2012), 9 pages.

Dasgupta, Sambarta et al., Real-Time Monitoring of Short-Term Voltage Stability Using PMU Data, IEEE Transactions on Power Systems, vol. 28, No. 4, Nov. 2013, pp. 3702-3711.

De La Ree, Jaime et al., Synchronized Phasor Measurement Applications in Power Systems, IEEE Transactions on Smart Grid, vol. 1, No. 1, Jun. 2010, pp. 20-27.

Fang, Xi et al., Smart Grid—The New and Improved Power Grid: A Survey, Communications Surveys & Tutorials, IEEE, vol. 14, No. 4, pp. 944-980 (2012).

Farhangi, Hassan, The Path of the Smart Grid, IEEE Power & Energy (Jan./Feb. 2010), pp. 18-28.

Gungor, V. Cagri et al., A Survey on Smart Grid Potential Applications and Communication Requirements, IEEE Transactions on Industrial Informatics, vol. 9, No. 1, Feb. 2013, pp. 28-42.

Hill, Cody A. et al., Battery Energy Storage for Enabling Integration of Distributed Solar Power Generation, IEEE Transactions on Smart Grid, vol. 3, No. 2, Jun. 2012, pp. 850-857.

Ju, Ping et al., Load Modeling for wide are power system, Electrical Power and Energy Systems 33 (2011) pp. 909-917.

Kschischang, Frank R. et al, Factor Graphs and the Sum-Product Algorithm, IEEE Transactions on Information Theory, vol. 47, No. 2, Feb. 2001, pp. 498-519.

Lee, Ching-Yin, Effects of Unbalanced Voltage on the Operation Performance of a Three-Phase Induction Motor, IEEE Transactions on Energy Conversion, vol. 14, No. 2, Jun. 1999, pp. 202-208.

Rieken, David W., Maximum-Likelihood Estimation of the Frequency Response of a Low Frequency Power-Line Communication Channel, IEEE (2008), pp. 228-233.

Rieken, David W. et al., Distance Effects in Low-Frequency Power Line Communications, IEEE (2010), pp. 22-27.

Rieken, David W., Periodic Noise in Very Low Frequency Power-Line Communications, IEEE International Symposium on Power Line Communications and Its Applications (2011) pp. 295-300.

Rieken, David W. et al., VLF-band Power Line Channel Sounding, 2014 18th IEEE International Symposium on Power Line Communications and Its Applications, pp. 18-23.

Tate, Joseph Euzebe et al., Line Outage Detection Using Phasor Angle Measurements, IEEE Transactions on Power Systems, Nov. 2007, pp. 1-8.

Terzija, Vladimir et al., Wide-Area Monitoring, Protection, and Control of Future Electric Power Networks, Proceedings of the IEEE, vol. 99, No. 1, Jan. 2011, pp. 80-93.

Varadarajan, Badri et al., Empirical Measurements of the Low-Frequency Power-Line Communications Channel in Rural North America, 2011 IEEE International Symposium on Power Line Communications and Its Applications, pp. 463-467.

Wu, Hongxia, PMU Impact on State Estimation Reliability for Improved Grid Security, IEEE (2006), pp. 1-3.

Xivambu, Mashangu Hudson, Impact of Floating Neutral in Distribution Systems, 19th International Conference on Electricity Distribution, Vienna, May 21-24, 2007, Paper 0300 (CIRED2007 Session 2), 4 pages.

Akankasha Eknath Pachpinde, Real Time Monitoring of Distribution Networks Using Internet Based PMU, Thesis submitted to the Faculty of the Graduate School of the University at Buffalo, State University of New York, 58 pages.

\* cited by examiner

FRAMEWORK FOR FAULT DETECTION AND LOCALIZATION IN POWER DISTRIBUTION NETWORKS

BACKGROUND

The present invention generally relates to power distribution networks and, in particular, a system and a method of efficiently detecting faults throughout the system using data analysis and probabilistic prediction techniques.

Power distribution networks often comprise many different nodes or points in the network and it is important to be able to detect when a node is powered and when a stretch of distribution line between nodes is faulted. Because the sensors used to detect the powered state at the many locations throughout the network may be noisy, it is preferable to view the state of the network at each point probabilistically. Furthermore, because of the scale of the network, computing the marginal probability density functions at each location in the graph is most often computationally impractical.

SUMMARY

In one form, a system for detecting faults in a power distribution network is described. The system includes data input devices coupled to the power distribution network, the data input devices receiving data from the power distribution network. A memory device is coupled to the one or more data input devices comprising a data management module that stores the received data from the one or more data input devices. A processing device comprising a processor is coupled to the memory device. The processing device comprising processor executable instructions for determining, based on the received data, a first estimated probability that each node of a plurality of nodes of the power distribution network is powered and determining, and a second estimated probability that each distribution line of a plurality of distribution lines connecting the plurality of nodes is faulted. The processing device further comprising processor executable instructions for assigning a visual characteristic to each node of the plurality of nodes based on the first estimated probability for the corresponding node and to each distribution line of the plurality of distribution lines based on the second estimated probability for the corresponding distribution line.

In another form, a method for detecting faults in a power distribution network is described. A signal is transmitted to a plurality of nodes in the power distribution network and received by the plurality of nodes in the power distribution network. One or more nodes of the plurality of nodes are monitored to determine a detection status of the transmitted signal. Using the detection status, a first estimated probability is calculated for each node in the power distribution network and a second estimated probability is calculated for each distribution line in the power distribution network. The first estimated probability indicating the likelihood that the nodes are powered and the second estimated probability indicating the likelihood that the distribution lines are not faulted.

Other objects and features will be in part apparent and in part pointed out hereinafter.

BRIEF DESCRIPTION OF THE DRAWINGS AND APPENDIX

Figure 1:
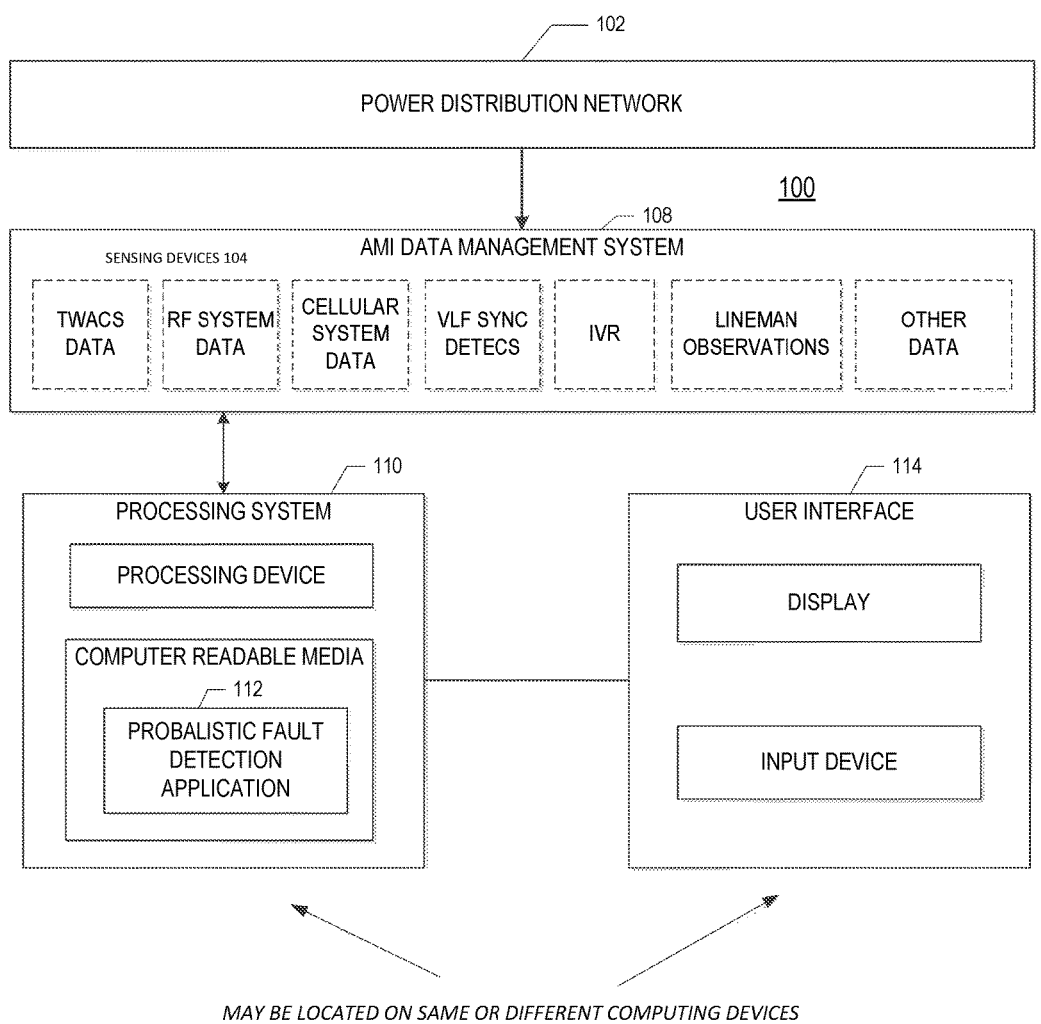
FIG. 1 is a block diagram showing the power distribution network and the connected devices and systems for implementing the described invention.

APPENDIX A illustrates the mathematical basis for the sum-product algorithm as described and it provides a pseudo code implementation of the algorithm.

Corresponding reference characters indicate corresponding parts throughout the drawings.

DETAILED DESCRIPTION

The described system connects to and receives data from a power distribution network. The system uses the received data to determine important information about the functionality of the network. FIG. 1 shows a block diagram 100 of the power distribution network 102, sensing devices 104, a data management system 108, a processing system 110, and a user interface 114. The processing system 110 includes a probabilistic fault detection (PFD) application 112. In the diagram 100, the sensing devices 104 are mechanically, electrically, and/or communicatively connected to aspects of the network 102. As illustrated in FIG. 1, the sensing devices (i.e., sensors) 104 (e.g. TWACS data, RF System Data, etc.) can be part of the data management system 108, although other configurations are also contemplated. The sensing devices 104 are also communicatively connected to the data management system 108, which is in turn communicatively connected to the processing system 110. The processing system is also electrically and/or communicatively connected to the user interface 114. In one form, the sensing devices 104 collect data that are not statistically independent of the state of the power distribution network 102 and relay that data to the PFD application 112. Thus, the sensing devices 104 need not be attached to the network in any way.

In an embodiment, the primary method of gathering data from the power distribution network 102 is through the use of sensing devices 104 connected to the network 102. The sensing devices 104 may be connected to the network 102 at the transmission lines, the distribution lines, the power substations, the power meters, or any other point that makes up the power distribution network 102. The system and method herein is described at the distribution level. However, the system and method herein can be generalized to transmission lines and, as used herein, transmission lines includes distribution lines. In an embodiment, the data collected by the sensing devices 104 comprises direct power data and data values which are indicative of the state of the network point to which the devices 104 are connected. In one embodiment, a sensing device (i.e., sensor) 104 is anything that provides data that is not statistically independent of the powered state of the network 102. Sensing devices 104 need not be connected to the network 102. As indicated in FIG. 1, customer calls and linemen observations are considered sensors for purposes of this system. Exemplary sensing devices 104 include, but are not limited to, those that detect electrical quantities, including voltage, electric current, electrical resistance, electrical conductance, electrical reactance, susceptance, magnetic flux, electrical power, inductance, capacitance, electrical impedance, electrical admittance, phase characteristics, frequency, gain, consumption, demand, time-of-use, reactive energy, power factor, Q-hour, apparent power, and the like. Exemplary sensing devices 104 that are indicative of the state of the network include customer calls, communication link data, thermal imagery of distribution lines, transient detectors, and the like. The sensing devices 104 are adapted to transmit data via a communication network. The communication network may be any network that facilitates the exchange of data, such as those that operate according to the IEEE 802.3 protocol (e.g., Ethernet), the IEEE 802.11 protocol (e.g., Wi-Fi), or the IEEE 802.16 protocol (e.g., WiMAX), for example. In another embodiment, the communication network is any medium that facilitates the physical transfer of data through serial or parallel communication channels (e.g., copper, wire, optical fiber, computer bus, cellular/wireless communication channel, radio frequency network, etc.).

According to one aspect, the data collected from the sensor 104 can include very low frequency (VLF) sync detection data, interactive voice response (IVR) data, lineman observation data, magnetic induction data, Supervisory Control and Data Acquisition (SCADA) data, infrared imagery data, and other data.

VLF sync detection data corresponds to responses that are detected or measured at targeted sites within the power distribution network 102 after one or more VLF band signals have been injected into the network 102. The process of detecting responses after injecting VLF band signals is described below in more detail.

IVR data includes data collected via an automated telephony system that interacts with callers to receive or gather information and/or route calls to an appropriate recipient. IVR data can be received through voice telephone input and/or touch-tone keypad selections.

For example, a lineman may use a data input device to record and communicate information about characteristics or properties of network 102.

Magnetic induction data includes data collected via a magnetic field sensing device. For example, the magnetic field sensing device may be a portable device that generates a measurable current when placed or positioned within a certain distance of an active or live power line.

Infrared (IR) imagery data includes data collected using an infrared sensing device. For example, the infrared sensing device senses whether the temperature of a particular component or equipment (e.g., switches, connectors, etc.) within the network 102 has exceeded a threshold temperature and, thus, is indicative of component or equipment failure. In one embodiment, the infrared sensing device measures the temperature of the conduction material to determine the current flowing through it.

Supervisory Control and Data Acquisition (SCADA) data corresponds to data acquired or collected through a SCADA system.

According to another aspect, the power distribution network 102 and/or the sensing devices 104 are components of an advanced metering infrastructure (AMI) system and the data management systems 108 collects and stores AMI data. The AMI data stored by the data management system includes, for example, Two-Way Automated Communication System (TWACS) data, Radio Frequency (RF) system data, and/or cellular system data.

TWACS data includes in-bound and/or out-bound messages that are communicated through power lines between substation communication equipment and remote communication equipment, such as a meter at a customer site. Outbound messages typically are used to check on the status of the power usage at the customer site (polling), convey instructions related to power usage at the site, etc. Inbound messages provide information or data about power usage at the customer site.

RF system data includes message data transmitted over a radio frequency between components of a smart power distribution network. For example, meters located at customer sites are equipped with a communication module that enables each meter to generate and transmit data via a RF communication signal to one or more components of the smart power distribution network.

Cellular system data includes data communicated between components of a smart power distribution network through a cellular communication network. For example, meters located at customer sites are equipped with a communication module that enables each meter to communicate data to one or more components of the smart power distribution network through a cellular communication infrastructure.

The processing system 110 connects to the data management system 108. For example, processing system 110 may be electrically connected to data management system 108 or communicatively connected via a communication network, such as those further described herein. The processing system 110 receives the data from the data management system 108 and processes it into useful information, which is then used to make decisions about the operation of the power distribution network 102. In an embodiment, the processing system 110 comprises a probabilistic fault detection application 112 stored on computer readable media for determining the probability that points within the network 102 are powered or faulted, as further described herein. For example, the probabilistic fault detection application 112 may be embodied as processor-executable instructions on the computer readable medium and execution of the instructions by a processing device of the processing system 110 provides a determination of the probability that points within the network 102 are powered or faulted. In an embodiment, the processing system 110 is further connected to a user interface 114 which enables users to view the results of the data processing of the processing system 110 via a display device and to interact with the system as a whole in response to the data processing. The processing system 110 and the user interface 114 may be embodied on the same computing device or on separate computing devices.

Figure 2:
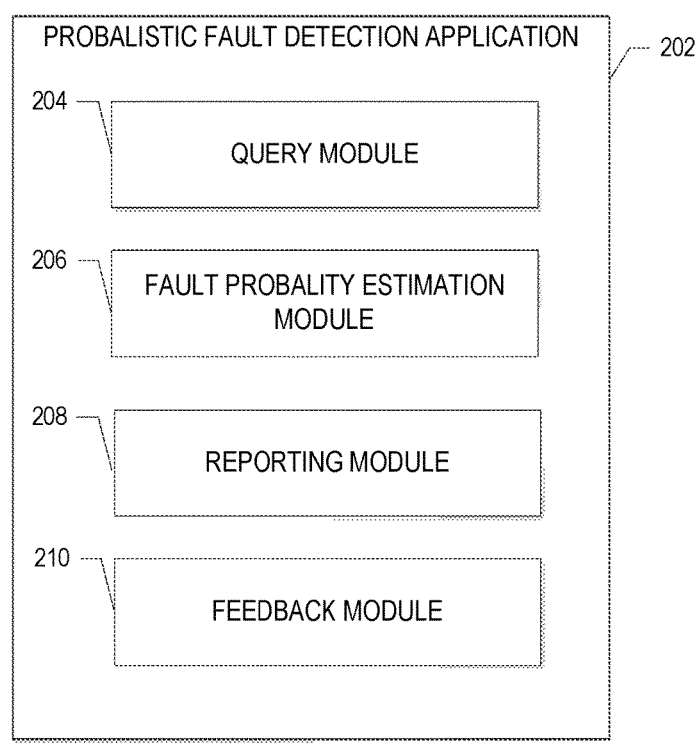
FIG. 2 is a block diagram showing the modules making up the probabilistic fault detection application.

The probabilistic fault detection (PFD) application 112 is a vital part of the described invention. FIG. 2 is a block diagram 200 representative of an exemplary PFD application 202 and the components thereof. In an embodiment, the PFD application 202 comprises a query module 204, a fault probability estimation module 206, a reporting module 208, and a feedback module 210. The four modules work in conjunction to interpret data gathered from the sensors 104 to provide information about the state of various points of the network. The query module 204 connects to the data management system 108 and is adapted to query for data and retrieve the data for use by the fault probability estimation module 206. The query module 204 may query the data management system 108 at regular intervals to ensure the most current data is being used. In an embodiment, query module 204 comprises processor-executable instructions embodied on the computer readable medium of processing system 110 to provide the query module 204 via a software environment. In an embodiment, query module 204 is adapted to retrieve data from data management system 108 by transmitting a query to data management system 108, which data management system 108 receives and uses to select stored data that satisfies the query. The data management system 108 then transmits the selected data to probability estimation module 206.

The probability estimation module 206 receives the data provided by the query module 204 and analyzes the data to generate probabilistic information about the state of points within the power distribution network 102. In an embodiment, the probability estimation module 206 executes an algorithm on the data in order to generate the results (e.g., probabilistic information). This algorithm is described further below and in Appendix A. This algorithm corresponds to a means for estimating fault probability, according to some embodiments. In an embodiment, probability estimation module 206 comprises processor-executable instructions embodied on the computer readable medium of processing system 110 to provide the probability estimation module 206 via a software environment.

The reporting module 208 takes the generated probabilistic information from the probability estimation module 206 and generates reports containing the information. The reports are generated in such a way as to provide the probabilistic information to users of the system in a useful and understandable way when displayed via a display device. In an embodiment, reporting module 208 comprises processor-executable instructions embodied on the computer readable medium of processing system 110 to provide the reporting module 208 via a software environment.

The feedback module 210 provides feedback to the data collection mechanisms (e.g., sensing devices 104) regarding nodes that should be targeted for data collection. In an embodiment, feedback module 210 uses computed probabilistic information to guide the data collection process for points within the power distribution network 102. For example, computed probabilities between very near 0 and very near 1 are reflective of certainty in the state of the network 102. Those nodes or groups of nodes with uncertain states (i.e. those nodes with computed probabilities not near 0 or 1) are targeted for data collection. In an embodiment the probability that a given node is targeted for data collection is proportional to the entropy of the computed probability of its state. This forms a feedback loop from the probability computation to the data management system 108. Among the advantages of this approach are that the computed probabilities detect regions of the network 102 for which the presently available data are insufficient. In an embodiment, feedback module 210 comprises processor-executable instructions embodied on the computer readable medium of processing system 110 to provide the feedback module 210 via a software environment.

According to another aspect, feedback module 210 generates and sends commands to the sensing devices 104 to collect data from one or more nodes neighboring a particular node with uncertain states. For example, if computed probabilities associated with a particular node are indicative of an uncertain state with respect to the status of that node, the feedback module 210 may command one or more data sensing devices to compute probabilistic information about nodes that are adjacent to and/or neighbor that particular node.

According to another aspect, the feedback module 210 associates or assigns a visual characteristic to elements of a distribution map (e.g., see FIG. 3) being displayed, for example, via the user interface 114. The visual characteristic may be a color, a symbol, text, or some other indicator that conveys the state of a particular node or edge within the power distribution network. For example, if the visual characteristic is a color, red may indicate a fault state, green may indicate an active or powered state, and yellow may indicate an uncertain state. In an embodiment, the feedback module 210 associates or assigns a first type of visual characteristic (e.g., color) to nodes and a second type of visual characteristic (e.g., text) to transmission lines. In another embodiment, the feedback module 210 associates or assigns a common visual characteristic to nodes and transmission lines (e.g., color for both, text for both, etc.).

Figure 3:
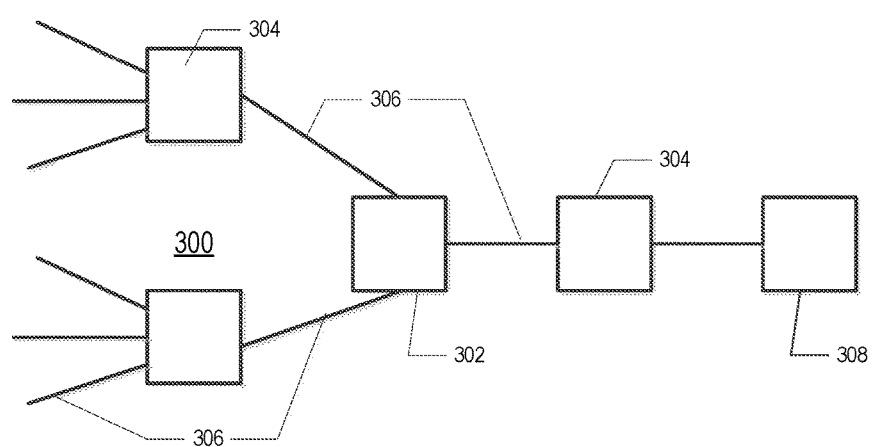
FIG. 3 is a diagram of nodes and edges representative of a power distribution network.

FIG. 3 shows a diagram of an exemplary power distribution network map 300 with nodes or vertices 302, 304, and 308 representing any electrical devices, branches, or other points on the network 102 and edges 306 representing the distribution lines connecting those points. In an embodiment, this representation is used by the PFD application 202 to determine probability states for each node 302, 304, and 308 and each edge 306. The diagram shows a node 302 at the center connected to adjacent nodes 304 by edges 306. The adjacent nodes have additional edges 306 that may connect to additional nodes not shown. It is important to be able to determine if the nodes of the network are powered and whether the distribution lines of the network are faulted or not.

In an embodiment, a power distribution network has at least one node which is a source node 308, which may be representative of a power substation, generator, or the like. The source node 308 is a node which provides power from outside the network to the nodes of the network via the distribution lines 306. A particular node 302 can only be powered if the distribution lines 306 between the source node 308 and the particular node 302 are not faulted and if the nodes between the source node 308 and the particular node 302 are powered. If the particular node 302 and the source node 308 are adjacent in the network and connected only by a single distribution line 306, then the distribution line 306 between them must not be faulted for node 302 to be powered. Depending on the complexity of the network, a node may be powered from the source node along more than one path through the network.

Data is gathered from the power distribution network which is correlated with power loss at nodes in the network. In an embodiment, the data gathered is stochastic in nature in that the data is randomly determined, having a random probability distribution or pattern that can be analyzed statistically but may not be predicted precisely. In one form, the data is correlated with power loss at nodes in a probabilistic way, not a purely deterministic way. The gathered data may be in the form of signals passed between nodes throughout the power distribution network. In an embodiment, the power distribution network comprises an active sounding system as described in U.S. Patent Application No. 62/057,300. A very low frequency (VLF) band signal is transmitted throughout the network and received at each node in the network in varying patterns. In an embodiment, the signal is a VLF-band spread spectrum signal followed by a VLF-band communications message signal ("signal") encoded with a unique identifier. When a concentrator device broadcasts a particular signal on the network, it also reports to a central processing station that it broadcast that particular signal with the unique identifier at that particular time. When a detector device detects the broadcasted signal, it decodes the signal and notifies the central processing station that it received a signal with the unique identifier. The central processing station can use a detection status of a transmitted signal to estimate the probability that each node in the network is powered and/or the probability that each stretch of distribution line is faulted. The detection status for a particular transmitted signal is, for example, a value, flag, or other attribute that indicates whether that particular transmitted signal was detected by the detection device.

According to one aspect, the central processing station can determine a detection rate for each detector device based on what percentage of broadcast signals they report receiving. The detection rate of the signal at each node constitutes a random process which contains information on the state of the network. In the event that a fault occurs in the network, the detection rate of the signal at affected nodes changes. The detection rate data gathered is used to estimate the probability that each node in the network is powered and the probability that each stretch of distribution line is faulted. In general, the algorithms described herein not necessarily need to compute a detection rate and wait for it to change. The relative merits of each hypothesis can re-evaluated with every detection and missed detection. In an embodiment, sensors may gather the data from the nodes of the network and/or from the distribution lines of the network. In another embodiment, the signal data as described above is passed throughout the network using TWACS communication technology. Other data sources may also be used, including SCADA data or even customer reporting data and manually entered data, so long as the data used are not statistically independent with the powered state of the network.

Figure 4:
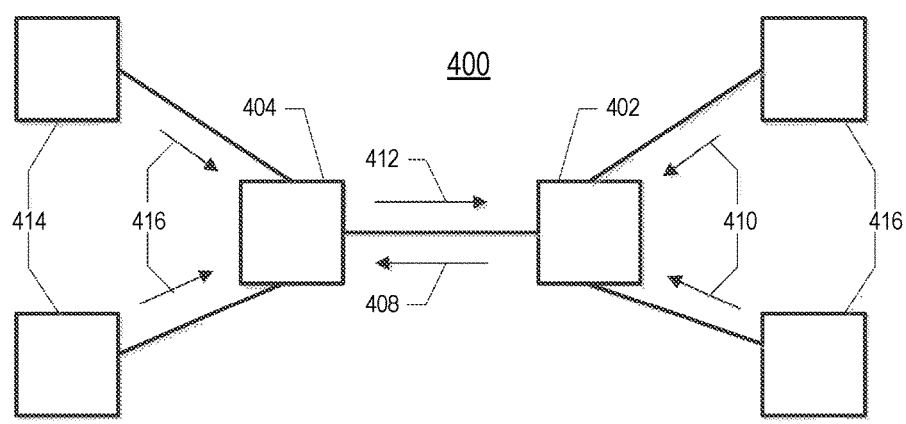
FIG. 4 is a diagram of message passing among the nodes representative of a power distribution network.

In an embodiment, the estimates of whether the nodes are powered or the distribution lines are faulted are calculated using the sum-product algorithm by the PFD application 202. Alternatively, a max-product algorithm can be used. The difference between the two is that the sum-product algorithm can be used to compute the minimal mean square error (MMSE) estimates of the state and the max-product is used to compute the maximum a-posteriori (MAP) estimates. The data are the same for both approaches, as is the structure of the message passing algorithm. One difference is in the equations used to compute the messages at each iteration of the algorithm. The nodes of the network pass messages to the other adjacent nodes and edges in the network. FIG. 4 shows a diagram of a group of nodes of a network 400 passing messages between each other. The message 408 passed from a first node 402 to a second node 404 comprises a combination of the information from the messages 410 sent to the first node 402 from all other adjacent nodes 406, not including the second node 404. Similarly, a message 412 passed from the second node 404 to the first node 402 comprises a combination of the information from the messages 416 sent to the second node 404 from all other adjacent nodes 414, not including the first node 402. In an embodiment, the messages being passed are probability density functions (PDFs) as described in Appendix A, including the Forney Factor graph as represented in FIG. 1 on page 4 of Appendix A. For a node to be powered one of the adjacent nodes must be powered and the distribution line between the two nodes must be connected. The probability that a node is powered is a function of the probabilities that the adjacent nodes are powered and the connecting distribution lines are not faulted. The messages being passed contain information about the probability that the node receiving the signal is powered. In an embodiment, the edges between the nodes also pass messages that include information about the probability that the distribution lines represented by the edges are faulted.

The data gathered from the network does not perfectly represent the state of the nodes and distribution lines. The data from a node may indicate that it is not powered when it actually is powered, or the data from the node may indicate that it is powered when it is not actually powered. The same applies for data gathered about a distribution line. The probability that the data being gathered for each node and distribution line is accurate is further used within the sum-product algorithm calculation.

The data gathered from the network may be data that is only from some of the nodes or some of the edges. A message passing algorithm such as the sum-product algorithm is implemented by the PFD application 202 to extrapolate the probabilities that apply to the other points in the network. The sum-product algorithm is an example of one fast method for computing the marginal PDF from the joint PDF of many variables. In this case, those many variables are the states of every edge and node in the power distribution graph. In one form, a belief propagation algorithm can be employed, where a message being passed from a node 402 to a node 404 contains information indicating the "belief" of the node 402 that the node 404 is powered based on the messages node 402 has received from other adjacent nodes 406 and any sort of functionality node 402 may itself provide. Belief propagation algorithms are a superset of the sum-product algorithm. They need not be rigorous. Many are heuristic. The sum-product algorithm is rigorous on graphs without loops and computes the marginal PDFs precisely. In an embodiment, aspects of the invention implement a sum-product algorithm to solve equations more quickly and efficiently than straightforward solutions. In another embodiment, aspects of the invention implement a sum-product algorithm to provide real-time updates of the faulted state of the network and alerts in less time than would otherwise be possible. The marginal PDF computed is conditioned on the detection status of every node in the network. The detection rate is a parameter of the PDF. In one embodiment, it is not estimated but considered it to be known. Other embodiments consider the detection rate an unknown nuisance parameter and estimate it by some method internal to the algorithm. See Appendix A.

In an embodiment, the data gathered is analyzed by a computer system executing the PFD application 202 and computing probabilities for each of the nodes and distribution lines, or edges, according to the sum-product or max-product algorithm calculation. The messages sent between the nodes and edges are dependent on other messages received. Due to this interdependence, the messages to send may be updated multiple times as the received messages also change. Eventually, the message values between the nodes and edges converge to stable values. In a Forney Factor graph (FFG) without cycles, the algorithm completes after a finite number of calculations, as noted in Appendix A. Once the algorithm completes or stabilizes, the message values between nodes and edges indicate the likelihood of a node in the network being powered or a distribution line in the network being connected. See Appendix A. for the algorithm pseudo code. In an embodiment, the algorithm allows aspects of the invention to fuse widely disparate sources of stochastic data and infer the state of the network. In another embodiment, the algorithm allows aspects of the invention to utilize numerous imprecise sensors to quickly deduce the probability that outages are occurring on the network and to locate the source of the problem causing the outages.

In FFGs' with cycles, the calculating and updating of the messages for each node and edge includes several different steps. These steps comprise assigning initial values to each node and edge in the network and creating initial messages from each node and edge based on the initial values. The initial values are based on the data gathered from the node or edge if available. Otherwise, the initial value is set to a positive value between 0 and 1. Based on the initial values, the algorithm iterates through the nodes and edges repeatedly, updating the messages for each.

Some variant of an iterative approach should be used on FFGs with cycles. Once the updated outgoing message components are calculated for each node in the network, the new incoming messages for each node and edge are processed and incorporated into the outgoing messages of the nodes and edges. The algorithm repeats. The algorithm loops repeatedly and may eventually converge to stable values for the messages between the nodes and edges. This approach is not necessary on FFGs without cycles.

The stable values at each point of the network represent estimations of the state of that point in the actual power distribution network. The values are then interpreted by users or other computer programs in order to determine if action needs to be taken based on the estimations. Whether a value is considered high or low is dependent on the network and the decisions of the manager of the power distribution network. In an embodiment, an additional algorithm is used to convert the estimation values at each point in the network to binary values indicating whether a given point is faulted or not.

Aspects of the invention relate to an algorithm for computing these probabilities across an entire network simultaneously using belief propagation techniques, such as an algorithm which examines the aggregate of all data collected across a network and uses it to estimate the probability that each point on the network is experiencing an outage. The algorithm is based on a Bayesian model relating the data set to the outage state of the network and relating the outage state at each point on the network to every other point on the network by a graph-based network topology. The sum-product algorithm and max-product algorithm are used to compute the minimum mean square error (MMSE) and maximum a posterior (MAP) estimates of the outage state, respectively. The results of these algorithms can also be used to identify those areas of the network for which the outage state is uncertain. Another algorithm embodying aspects of the invention directs meter interrogations to most quickly resolve those areas of ambiguity.

A pseudocode implementation of a message passing algorithm is given in algorithm 1. This function solves for an entire graph by calling the recursive functions in algorithms 2 and 3. The message passing algorithm is the same for the MAP algorithm as it is for the MMSE algorithm, with the exception that the form of the messages is different. For the MMSE algorithm:

$$\text{forwardAnd}(a,b) = a+b-\ln(1+\exp(a)+\exp(b))$$

$$\text{backwardAnd}(a,b) = \ln(1+\exp(a+b))-\ln(1+\exp(a))$$

And for the MAP algorithm:

$$\text{forwardAnd}(a,b) = \min(a+b,b,a)$$

$$\text{backwardAnd}(a,b) = \ln\left(\frac{\max(1, e^{a+b})}{\max(1, e^a)}\right)$$

Algorithm 1. This algorithm solves for the entire graph.
   function MP(G,$v_s$)
     for v∈V do
       v.color→white
     end for
     update($v_s$)
     downdate($v_s$)
   end function Algorithm 2. This recursive function passes messages up from the leaves.

function UPDATE (v, e)
     if v.sensor then
       v.φ ← dataIn(v, d(v))
     else if v = $v_s$ then
       v.φ ← ∞
     else
       v.φ ← 0
     end if
     v.γ ← v.φ
     v.color ← gray
     [ω, f] ← Adj(G, v)
     for i = 1 to length (ω) do
       if $ω_i$.color = white then
         update ($ω_i$, $f_i$)
         v.γ ← v.γ + $ω_i$.μ
       end if
     end for
     if v ≠ $v_s$ then $$v \cdot \phi \leftarrow \ln\left(\frac{1 - p(e \cdot \theta_v = 0)}{p(e \cdot \theta_v = 0)}\right)$$

v.μ ← backwardAnd(v.ψ, v.γ)
     end if
   end function

Algorithm 3. This recursive function passes messages down the tree from the vertex $v_s$ to the leaves.

function DOWNDATE(v, μ', e)
     if v = $v_s$ then
       v.γ' ← 0
     else
       v.ψ' ← backwardAnd(μ', v.γ)

$$e \cdot \theta \leftarrow \frac{\exp(v, \omega' + v \cdot \psi)}{1 + \exp(v \cdot \psi' + v \cdot \psi)}$$

v.γ' ← forwardAnd(μ', v.ψ)
     end if
     $L_p$ ← v.γ + v.γ'

$$v \cdot x \leftarrow \frac{\exp(L_p)}{1 + \exp(L_p)}$$

v.color ← black
     [ω, f] ← Adj (G, v)
     for i = 1 to length (ω) do
       if $ω_i$.color = gray then
         downdate ($ω_i$, $L_p$ - $ω_i$.μ, $f_i$)
       end if
     end for
   end function Algorithm 4 is an algorithm for computing the message passed to the network graph based on a factor graph. The function $f$ depends on whether the MMSE or MAP is to be computed. For the MMSE:

$$f(\Gamma^+) = \ln\frac{p_{01} + e^{\Gamma^+}(1 - p_{10})}{(1 - p_{01}) + e^{\Gamma^+}p_{10}}$$

For the MAP estimate:

$$f(\Gamma^+) = \ln\left(\frac{\max(p_{01}(1 - p_{10})e^{\Gamma^+})}{\max((1 - p_{01})p_{10}e^{\Gamma^+})}\right)$$

Algorithm 4. An algorithm for computing φ.
   function DATAIN(v,d)
     for n=1 to N do
       if $d_n$(v)=0 then

```
        α_n ← 0
    else if d_n(v)=0 then
        α_n ← -ln(1-P_D(v))-ln(1-P_FA(v))
    else
        α_n ← -lnP_D(v)-lnP_FA(v)
    end if
    if n=1 then
        Γ_n^- ← 0
    else
        Γ_n^- ← f(Γ_{n-1}^+)
    end if
    Γ_n^+ ← Γ_n^- + α_n
    end for
    φ(v) ← Γ_N^+
end function
```

The Abstract and summary are provided to help the reader quickly ascertain the nature of the technical disclosure. They are submitted with the understanding that they will not be used to interpret or limit the scope or meaning of the claims. The summary is provided to introduce a selection of concepts in simplified form that are further described in the Detailed Description. The summary is not intended to identify key features or essential features of the claimed subject matter, nor is it intended to be used as an aid in determining the claimed subject matter.

For purposes of illustration, programs and other executable program components, such as the operating system, are illustrated herein as discrete blocks. It is recognized, however, that such programs and components reside at various times in different storage components of a computing device, and are executed by a data processor(s) of the device.

Although described in connection with an exemplary computing system environment, embodiments of the aspects of the invention are operational with numerous other general purpose or special purpose computing system environments or configurations. The computing system environment is not intended to suggest any limitation as to the scope of use or functionality of any aspect of the invention. Moreover, the computing system environment should not be interpreted as having any dependency or requirement relating to any one or combination of components illustrated in the exemplary operating environment. Examples of well-known computing systems, environments, and/or configurations that may be suitable for use with aspects of the invention include, but are not limited to, personal computers, server computers, handheld or laptop devices, multiprocessor systems, microprocessor-based systems, set top boxes, programmable consumer electronics, mobile telephones, network PCs, minicomputers, mainframe computers, distributed computing environments that include any of the above systems or devices, and the like.

Embodiments of the aspects of the invention may be described in the general context of data and/or processor-executable instructions, such as program modules, stored one or more tangible, non-transitory storage media and executed by one or more processors or other devices. Generally, program modules include, but are not limited to, routines, programs, objects, components, and data structures that perform particular tasks or implement particular abstract data types. Aspects of the invention may also be practiced in distributed computing environments where tasks are performed by remote processing devices that are linked through a communications network. In a distributed computing environment, program modules may be located in both local and remote storage media including memory storage devices.

In operation, processors, computers and/or servers may execute the processor-executable instructions (e.g., software, firmware, and/or hardware) such as those illustrated herein to implement aspects of the invention.

Embodiments of the aspects of the invention may be implemented with processor-executable instructions. The processor-executable instructions may be organized into one or more processor-executable components or modules on a tangible processor readable storage medium. Aspects of the invention may be implemented with any number and organization of such components or modules. For example, aspects of the invention are not limited to the specific processor-executable instructions or the specific components or modules illustrated in the figures and described herein. Other embodiments of the aspects of the invention may include different processor-executable instructions or components having more or less functionality than illustrated and described herein.

The order of execution or performance of the operations in embodiments of the aspects of the invention illustrated and described herein is not essential, unless otherwise specified. That is, the operations may be performed in any order, unless otherwise specified, and embodiments of the aspects of the invention may include additional or fewer operations than those disclosed herein. For example, it is contemplated that executing or performing a particular operation before, contemporaneously with, or after another operation is within the scope of aspects of the invention.

When introducing elements of aspects of the invention or the embodiments thereof, the articles "a," "an," "the," and "said" are intended to mean that there are one or more of the elements. The terms "comprising," "including," and "having" are intended to be inclusive and mean that there may be additional elements other than the listed elements.

In view of the above, it will be seen that several advantages of the aspects of the invention are achieved and other advantageous results attained.

Not all of the depicted components illustrated or described may be required. In addition, some implementations and embodiments may include additional components. Variations in the arrangement and type of the components may be made without departing from the spirit or scope of the claims as set forth herein. Additional, different or fewer components may be provided and components may be combined. Alternatively or in addition, a component may be implemented by several components.

The above description illustrates the aspects of the invention by way of example and not by way of limitation. This description enables one skilled in the art to make and use the aspects of the invention, and describes several embodiments, adaptations, variations, alternatives and uses of the aspects of the invention, including what is presently believed to be the best mode of carrying out the aspects of the invention. Additionally, it is to be understood that the aspects of the invention is not limited in its application to the details of construction and the arrangement of components set forth in the following description or illustrated in the drawings. The aspects of the invention are capable of other embodiments and of being practiced or carried out in various ways. Also, it will be understood that the phraseology and terminology used herein is for the purpose of description and should not be regarded as limiting.

The invention claimed is:

1. A system for detecting faults in a power distribution network, the power distribution network comprising a plurality of nodes connected by a plurality of transmission lines, the system comprising:

one or more sensing devices coupled to the power distribution network, the sensing devices receiving stochastic data from the power distribution network representative of a power state of each of the plurality of nodes and whether each of the plurality of transmission lines is faulted;

a memory device coupled to the one or more sensing devices, the memory device comprising a data management module, the data management module storing the stochastic data received by the one or more sensing devices;

a processing device coupled to the memory device, the processing device comprising a processor configured to execute a probabilistic fault detection application, the probabilistic fault detection application including a query module, a fault probability estimation module, a reporting module, and a feedback module, wherein the probabilistic fault detection application comprises processor executable instructions stored on the memory device, wherein the instructions, when executed by the processor, configure the processor for:

retrieving, via the query module, the received stochastic data from the memory device, wherein the retrieved stochastic data comprises the power state of each of the plurality of nodes and whether each of the plurality of transmission lines is faulted;

generating, via the fault probability estimation module based on the retrieved stochastic data, a first estimated probability that each node of the plurality of nodes of the power distribution network is powered, wherein said generating the first estimated probability comprises calculating a first marginal probability density function from a joint probability density function of the states of the plurality of nodes using a sum-product algorithm;

generating, via the fault probability estimation module based on the retrieved stochastic data, a second estimated probability that each transmission line of the plurality of transmission lines connecting the plurality of nodes is faulted, wherein said generating the second estimated probability comprises calculating a second marginal probability density function from a joint probability density function of the states of the plurality of transmission lines using the sum-product algorithm;

determining which of the plurality of nodes are powered and whether the distribution lines of the network connected thereto are faulted based on the first and second estimated probabilities;

generating, via the reporting module, a distribution map comprising the plurality of nodes and the plurality of transmission lines for display;

assigning, via the feedback module, a first visual characteristic to each node of the plurality of nodes on the distribution map to visually indicate the first estimated probability that the corresponding node is powered; and assigning, via the feedback module, a second visual characteristic to each transmission line of the plurality of transmission lines on the distribution map to visually indicate the second estimated probability that the corresponding transmission line is faulted.

2. The system of claim 1, wherein determining the first estimated probability and the second estimated probability further comprises calculating messages to be sent between the nodes and transmission lines of a graph representative of the network.

3. The system of claim 2, wherein the messages comprise probability density functions.

4. The system of claim 1, wherein the data from the power distribution network comprises at least one of:
very low frequency (VLF) sync detection data;
interactive voice response (IVR) data;
lineman observation data;
magnetic induction data;
supervisory control and data acquisition (SCADA) data;
infrared imagery data;
two-way automated communication system data;
radio frequency system data; and
cellular system data.

5. The system of claim 1, wherein the first visual characteristic and the second visual characteristic comprise a common visual characteristic.

6. A method for detecting faults in a power distribution network comprising:
collecting stochastic data from a power distribution network comprising a plurality of nodes connected by a plurality of transmission lines, the stochastic data comprising a power state of each of the plurality of nodes and whether each of the plurality of transmission lines is faulted;

receiving the stochastic data at a processing device;

generating, by the processing device executing a fault probability estimation module and based on the received stochastic data, a first estimated probability that each node of the plurality of nodes of the power distribution network is powered, said generating the first estimated probability comprising calculating a first marginal probability density function from a joint probability density function of the states of the plurality of nodes via a sum-product algorithm;

generating, by the processing device executing the fault probability estimation module and based on the received stochastic data, a second estimated probability that each transmission line of plurality of transmission lines connecting the plurality of nodes is faulted, said generating the second estimated probability comprising calculating a second marginal probability density function from a joint probability density function of the states of the plurality of transmission lines via the sum-product algorithm;

determining which of the plurality of nodes are powered and whether the distribution lines of the network connected thereto are faulted based on the first and second estimated probabilities;

generating, by the processing device executing a reporting module, a distribution map comprising graphical representations of the plurality of nodes and the plurality of transmission lines for display via a display device;

assigning, by the processing device executing a feedback module, a first visual characteristic to the graphical representation of each node of the plurality of nodes to visually indicate the first estimated probability that the corresponding node is powered; and assigning, by the processing device executing the feedback module, a second visual characteristic to the graphical representation of each transmission line of the plurality of transmission lines to visually indicate the second estimated probability that the corresponding transmission line is faulted.

7. The method of claim 6, wherein determining the first estimated probability and the second estimated probability further comprises calculating messages to be sent between the nodes and transmission lines of a graph representative of the network.

8. The method of claim 7, wherein the messages comprise probability density functions.

9. The method of claim 6, wherein the data from the power distribution network comprises at least one of:
    very low frequency sync detection data;
    interactive voice response (IVR) data;
    lineman observation data;
    magnetic induction data;
    supervisory control and data acquisition (SCADA) data;
    infrared imagery data;
    two-way automated communication system data;
    radio frequency system data; and
    cellular system data.

10. The method of claim 6, wherein the data are collected by one or more sensing devices that are observing the power distribution network and capable of relaying their data to the processing device.

11. The method of claim 6, wherein the first visual characteristic and the second visual characteristic comprise a common visual characteristic.

12. A method for detecting faults in a power distribution network, comprising:
    transmitting, by a concentrator device, a signal to a plurality of nodes in the power distribution network;
    notifying a central processing station, by the concentrator device, of said transmitting;
    receiving, by the plurality of nodes, the transmitted signal;
    monitoring, by the central processing station for one or more nodes of the plurality of nodes, a detection status of the received signal;
    generating, by the central processing station based on the detection status, a first estimated probability that each node of the plurality of nodes is powered, said generating the first estimated probability comprising calculating a first marginal probability density function from a joint probability density function of the detection status of the plurality of nodes via a sum-product algorithm;
    generating, by the central processing station based on the detection status, a second estimated probability that each distribution line of a plurality of distribution lines connecting the plurality of nodes is faulted, said generating the second estimated probability comprising calculating a second marginal probability density function from a joint probability density function of the detection status of the plurality of nodes via the sum-product algorithm; and
    determining which of the plurality of nodes are powered and whether the distribution lines of the network connected thereto are faulted based on the first and second estimated probabilities.

13. The method of claim 12, wherein the detection status comprises an attribute indicative of a detection of the transmitted signal by one or more nodes of the plurality of nodes.

14. The system of claim 1, wherein the instructions, when executed by the processing device, configure the probabilistic fault detection application for providing, via the feedback module when the generated first estimated probability for one or more nodes of the plurality of nodes is uncertain, feedback to the one or more sensing devices to collect data from the one or more nodes corresponding to the uncertain first estimated probability.

15. The system of claim 1, wherein the instructions, when executed by the processing device, configure the probabilistic fault detection application for providing, via the feedback module when the generated first estimated probability for one or more nodes of the plurality of nodes is uncertain, feedback to the one or more sensing devices to collect data from one or more nodes neighboring each of the one or more nodes corresponding to the uncertain first estimated probability.

16. The method of claim 10, further comprising providing, by the processing device executing the feedback module when the generated first estimated probability for one or more nodes of the plurality of nodes is uncertain, feedback to the one or more sensing devices to collect data from the one or more nodes corresponding to the uncertain first estimated probability.

17. The method of claim 10, further comprising providing, by the processing device executing the feedback module when the generated first estimated probability for one or more nodes of the plurality of nodes is uncertain, feedback to the one or more sensing devices to collect data from one or more nodes neighboring each of the one or more nodes corresponding to the uncertain first estimated probability.

* * * * *